US011791249B2

(12) United States Patent
Khanolkar

(10) Patent No.: US 11,791,249 B2
(45) Date of Patent: Oct. 17, 2023

(54) THERMALLY ENHANCED ISOLATED POWER CONVERTER PACKAGE

(71) Applicant: Texas Instruments Incorporated, Dallas, TX (US)

(72) Inventor: Vijaylaxmi Gumaste Khanolkar, Pune (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 110 days.

(21) Appl. No.: 17/515,150

(22) Filed: Oct. 29, 2021

(65) Prior Publication Data

US 2023/0135932 A1 May 4, 2023

(51) Int. Cl.
*H01L 23/495* (2006.01)
*H01L 23/31* (2006.01)
*H01L 23/00* (2006.01)
*H01L 25/00* (2006.01)
*H01L 21/56* (2006.01)
*H02M 3/00* (2006.01)
*H02M 3/335* (2006.01)

(52) U.S. Cl.
CPC ........ *H01L 23/49575* (2013.01); *H01L 21/56* (2013.01); *H01L 23/3107* (2013.01); *H01L 23/49513* (2013.01); *H01L 23/49517* (2013.01); *H01L 23/49562* (2013.01); *H01L 23/49568* (2013.01); *H01L 24/48* (2013.01); *H01L 24/73* (2013.01); *H01L 24/92* (2013.01); *H01L 25/50* (2013.01); *H02M 3/003* (2021.05); *H01L 2224/48177* (2013.01); *H01L 2224/73265* (2013.01); *H01L 2224/92247* (2013.01); *H02M 3/335* (2013.01)

(58) Field of Classification Search
CPC .............. H01L 23/49575; H01L 21/56; H01L 23/3107; H01L 23/49513; H01L 23/49517; H01L 23/49562; H01L 23/49568; H01L 24/48; H01L 24/73; H01L 24/92; H01L 25/50; H01L 2224/48177; H01L 2224/73265; H01L 2224/92247
USPC ....................................................... 257/676
See application file for complete search history.

(56) References Cited

U.S. PATENT DOCUMENTS 6,724,631 B2 4/2004 Ye et al.
11,482,477 B2 * 10/2022 Khanolkar .............. H01L 24/48
(Continued)

*Primary Examiner* — Kimberly N Rizkallah
*Assistant Examiner* — Dilinh P Nguyen
(74) *Attorney, Agent, or Firm* — Ronald O. Neerings; Frank D. Cimino

(57) ABSTRACT

An isolated power converter package includes a leadframe including a first and second die pad, first and second supports connected to first leads, second leads, at least one downset pad, and at least one downset feature between the supports and downset pad. A first semiconductor die is on the first die pad and a second semiconductor die is on the second die pad. The transformer stack includes a top and bottom side magnetic sheet on respective sides of a laminate substrate including an embedded coil that has coil contacts. Edges of the laminate substrate are on the supports. Bond wires are between the first die bond pads and the second leads, between the second die bond pads and the second leads, between the first die bond pads and coil contacts, and between the second die bond pads and the coil contacts. The downset pad is exposed from a mold compound.

20 Claims, 6 Drawing Sheets

(56) References Cited

U.S. PATENT DOCUMENTS

2021/0375525 A1* 12/2021 Kao .................. H01L 28/10
2022/0028593 A1* 1/2022 Tang ................ H01L 23/49575

* cited by examiner

THERMALLY ENHANCED ISOLATED POWER CONVERTER PACKAGE

FIELD

This Disclosure relates to isolated power converter packages that include a laminate transformer stack for the isolation.

BACKGROUND

Transformers are used in a variety of applications to step-up and/or step-down voltages, while providing galvanic isolation between an input and an output. In a multi-phase transformer, windings associated with each phase are wrapped around separate legs of a magnetic core which comprises coil(s).

Some isolated power converter packages such as DC/DC converter packages include transformers for stepping up or stepping down a received input voltage. The transformer can comprise a transformer stack sometimes referred to as being a laminate transformer that includes a laminate substrate which comprises a dielectric material having at least one embedded coil, generally including iron as the core metal for the coil to meet the requirement of a ferromagnetic metal core, with a top magnetic sheet and a bottom magnetic sheet on respective sides of the laminate substrate. The lamination of iron cores in transformers is to limit the generation of what are called eddy currents. By laminating the cores, current paths within that core are broken up to thus limit eddy currents. Some transformers may include a lamination layer but do not include a ferromagnetic metal core such as iron, and are thus referred to as being transformers having air-cores.

SUMMARY

This Summary is provided to introduce a brief selection of disclosed concepts in a simplified form that are further described below in the Detailed Description including the drawings provided. This Summary is not intended to limit the claimed subject matter's scope.

Thermal impedance is recognized to limit the maximum isolated power transfer capability for isolated power converter packages that include a transformer stack. It is recognized herein that there is a high thermal resistance path between the transformer stack's coil(s) embedded in the laminate substrate that become a primary heat source of the transformer stack during operation to the system heatsink that normally comprises a printed circuit board (PCB). In this known arrangement there is no direct thermal path for heat dissipation from the (coil(s) in the laminate substrate of the transformer stack to a system heatsink, such as to a PCB.

Disclosed aspects include an isolated power converter package includes a leadframe including a first and second die pad, supports for supporting a transformer stack connected to a first plurality of leads, a second plurality of leads, a downset pad, and a downset feature between the supports and the downset pad. A first semiconductor die including first bond pads is on the first die pad and a second semiconductor die including second bond pads is on the second die pad. The transformer stack includes a top and a bottom side magnetic sheet on respective sides of a laminate substrate that includes a coil embedded within a dielectric material, including coil contacts on a top surface of the laminate substrate.

Edges of the laminate substrate are attached to the supports. Bond wires are between the first bond pads and the second plurality of leads, between the second bond pads and the second plurality of leads, between the first bond pads and the coil contacts, and between the second bond pads and others of the coil contacts. A mold compound provides encapsulation for the first semiconductor die, the second semiconductor die, and the transformer stack. The downset pad is exposed from the mold compound.

BRIEF DESCRIPTION OF THE DRAWINGS

Reference will now be made to the accompanying drawings, which are not necessarily drawn to scale, wherein.

DETAILED DESCRIPTION

Figure 1:
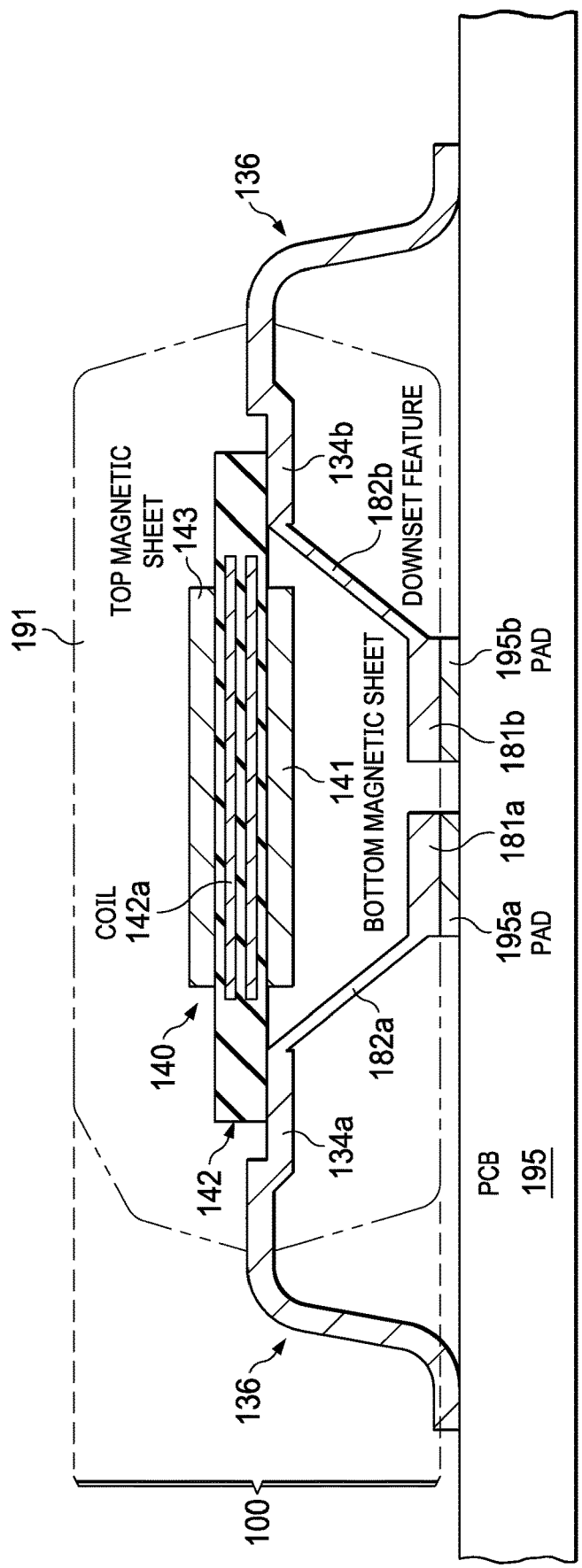
FIG. 1 is a cross-sectional view of an example isolated DC/DC converter package (ICs not shown in this cross-sectional view) including a leadframe having supports for a transformer stack comprising a laminate substrate having at least one coil embedded therein, where the isolated DC/DC converter package is mounted onto a heatsink shown as a PCB. The laminate substrate is connected by a downset feature from the supports to an exposed downset pad to provide a thermal path to a metal pad on a top surface of the PCB to provide enhanced cooling for the transformer stack.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Disclosed aspects include an isolated power converter package comprising a transformer stack that includes a leadframe that includes at least one downset pad and a metal feature connected between downset pad and the supports of the leadframe used for attaching the transformer stack thereon. The leadframe can comprise a conventional leadframe such as a small outline integrated circuit (SOIC), thin small outline package (TSOP), heatsink small outline package (HSOP) leadframe, or a conventional leadless leadframe such as quad flat no leads (QFN) leadframe, a multi-layer leadframe such as a Molded Interconnect Substrate (MIS), or a routable leadframe. Disclosed isolated power converter packages can take into account isolation spacing rules and to ensure compatibility with conventional assembly processing to enable leveraging existing manufacturing infrastructure so that no capital investment is needed to implement disclosed isolated power converter packages.

The heat source being the embedded coil(s) within the laminate substrate of the transformer stack is attached to the supports, which are directly metal connected by a downset feature to the downset pad. The downset feature is generally customized to meet the isolation spacing requirements and to ensure no impact to moldability. Disclosed aspects can generally be applied to all leaded and leadless isolated power converter packages.

The downset pad can be connected to a ground plane on a PCB that can have a matrix (a plurality) of thermal through-vias, thus providing a reduced thermal impedance for heat dissipation for the heat generated by the coil(s) that is received from the downset pad. Thermal vias refer to vias on a PCB connecting a ground (GND) first metal layer to the second layer of GND plane. Thermal vias are typically a matrix of vias that help in improving the thermal dissipation through the thickness of the PCB. Depending on the isolated power converter package type and size, the leadframe design can be customized to have a single or double downset pad.

FIG. 1 is a cross-sectional view of a disclosed isolated power converter package 100 including a transformer stack 140 (ICs not shown in this cross-section), and a leadframe having supports 134a, 134b for supporting a transformer stack 140 comprising a laminate substrate 142 having at least one coil 142a embedded in a dielectric material of the laminate substrate 142. There is a mold compound 191 for providing encapsulation for the isolated power converter package 100.

The transformer stack 140 includes a top magnetic sheet 143 and a bottom magnetic sheet 141, with the laminate substrate 142 between the top and bottom magnetic sheets. The isolated DC/DC converter package is mounted onto a heatsink shown as a PCB 195 that has top side pads 195a and 195b that are each generally connected to thermal vias (not shown). The laminate substrate 142 is thermally connected by the supports 134a, 134b that are mounted on using a thermally conductive attach material, to at least one downset feature shown as downset features 182a, 182b of the leadframe connecting from the respective supports 134a, 134b to at least one downset pad shown as downset pads 181a, 181b, that are exposed from the mold compound 191 at a bottom side of the isolated power converter package 100.

There can be a single or more than two downset pads 181, and there can be a single or more than two downset features. As used herein the term thermally conductive adhesive or thermally conductive die attach material refers to a material having a thermal conductivity of at least 1 W/m·K, where the thermally conductive material can comprise a metal particle filled epoxy material, ceramic, a composite material, solder, or sintered nanoparticles. The downset pads 181a, 181b being exposed from the mold compound 191 provide a thermal path to a metal pad 195a and 195b of the PCB 195 to provide enhanced cooling for the transformer stack 140.

The downset features 182a, 182b can be connected, generally integrally connected, meaning without any sort of adhesive as it is the same piece of metal such as copper, to one or both of the supports 134a, 134b. Moreover, the downset feature(s) 182a, 182b can be more than the single wire shown in FIG. 1, so that for example it can be configured as a sheet of metal that covers an entire length of the respective supports. The downset feature(s) can be created by a suitable lead forming method that includes bending to provide the downset feature(s).

Figure 2:
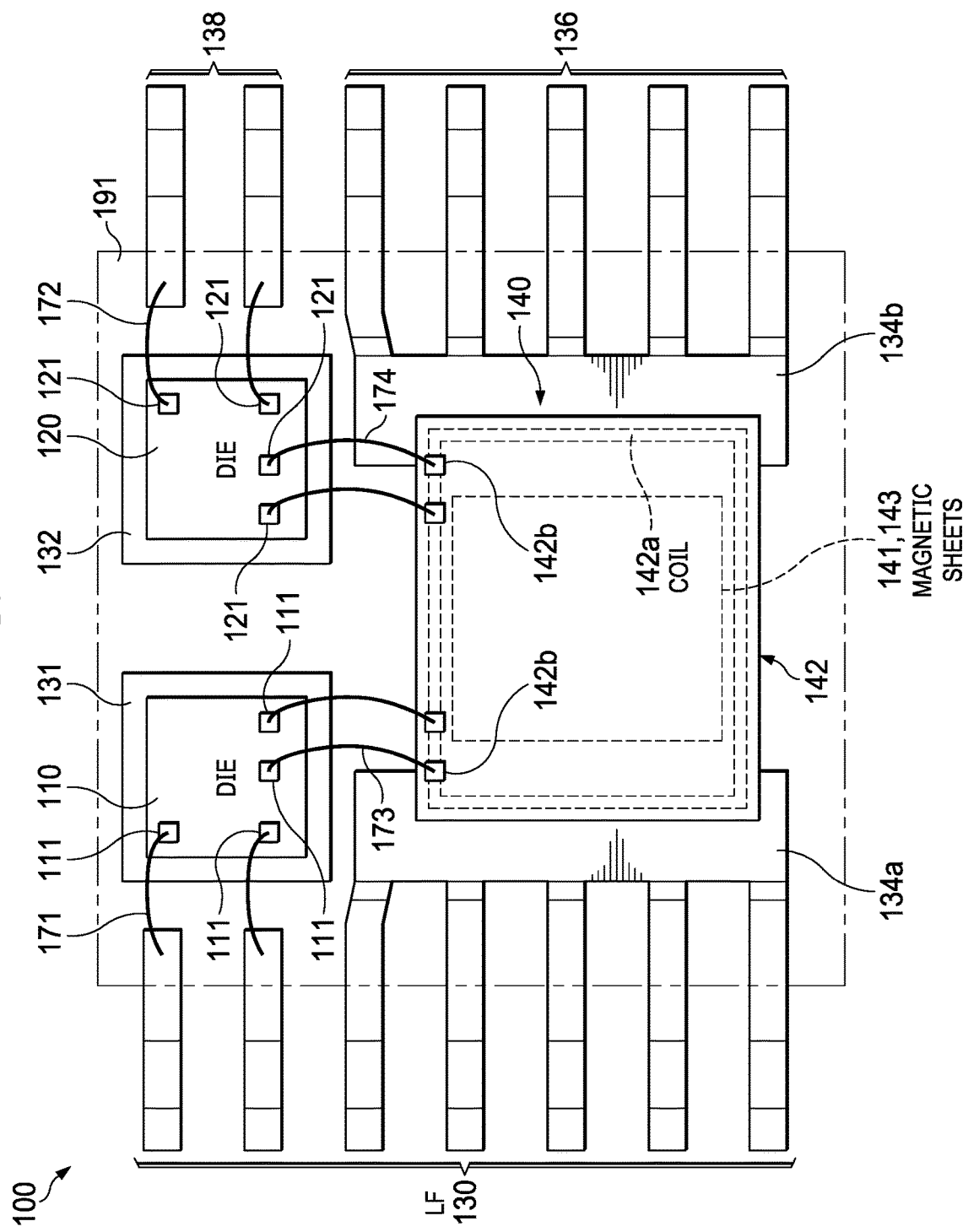
FIG. 2 is a top view looking through the mold compound of an example isolated power converter package comprising a leadframe including first and second die pads having first and second semiconductor die mounted thereon, and supports. There is a transformer stack comprising a top side magnetic sheet and a bottom side magnetic sheet on respective sides of a laminate substrate. There is a downset feature between the supports and an exposed downset pad that is exposed from the mold compound at a bottom side of the isolated power converter package.

FIG. 2 is a top view looking through the mold compound 191 of an example isolated power converter package 100 comprising a leadframe 130 including a first die pad 131 and a second die pad 132, including a first semiconductor die 110 including first bond pads 111 mounted topside up on the first die pad 131 and a second semiconductor die 120 including second bond pads 121 mounted topside up on the second die pad 132. The leadframe 130 also includes a first plurality of leads 136, and a second plurality of leads 138, and supports 134a, and 134b for supporting the laminate substrate 142 of the transformer stack 140, where the supports 134a, 134b are connected to respective sides of the first plurality of leads 136. The transformer stack 140 may also be referred to as being a laminate transformer.

The transformer stack 140 comprises a bottom magnetic sheet 141 and a top magnetic sheet 143 on respective sides of the laminate substrate 142 that comprises at least one coil 142a embedded within a dielectric material. The laminate substrate 142 includes coil contacts 142b positioned on its top surface. Although not capable of being shown in this FIG., at least one downset feature (shown as 182a, 182b in FIG. 1) is connected between the supports 134a, 134b and the downset pad (shown as 181a, 181b in FIG. 1) that is under the transformer stack 140. Edges of the laminate substrate 142 are attached to the supports 134a, 134b, generally by a thermally conductive adhesive.

There are shown bond wires 171 between the first bond pads 111 and the second plurality of leads 138, bond wires 172 between the second bond pads 121 and the second plurality of leads 138, and bond wires 173 between the first bond pads 111 and the coil contacts 142b (connected to one side of the coil 142a), and bond wires 174 between the second bond pads 121 and others of the coil contacts 142b (connected to the other side of the coil 142a). The mold compound 191 provides encapsulation for the first semiconductor die 110, for the second semiconductor die 120, and for the transformer stack 140. As noted above, at least one downset pad is exposed from the mold compound 191 at a bottom side of the isolated power converter package 100 which is shown in FIG. 3B, described below.

The downset feature(s) together with the downset pad(s) exposed from the mold compound 191 enables the downset pad(s) to function as a thermal pad for the transformer stack 140 enabling the isolated power converter package 100 to be operated at a higher power level than otherwise possible. The respective bottom and top magnetic sheets 141 and 143 can be glued by an adhesive to the respective sides of the laminate substrate 142. A function of the bottom and top magnetic sheets 141 and 143 is to control the magnetic field around the coil 142a embedded within the laminate substrate 142.

The laminate substrate 142 can be mounted onto the supports 134a, 134b using an adhesive material that generally comprises a thermally conductive adhesive material which provides a 25° C. thermal conductivity of at least 1 W/mK, such as at least 10 W/m·K. The adhesive material can comprise a metal particle filled epoxy material, a ceramic, a composite material, solder, or sintered nanoparticles.

Figure 3A:
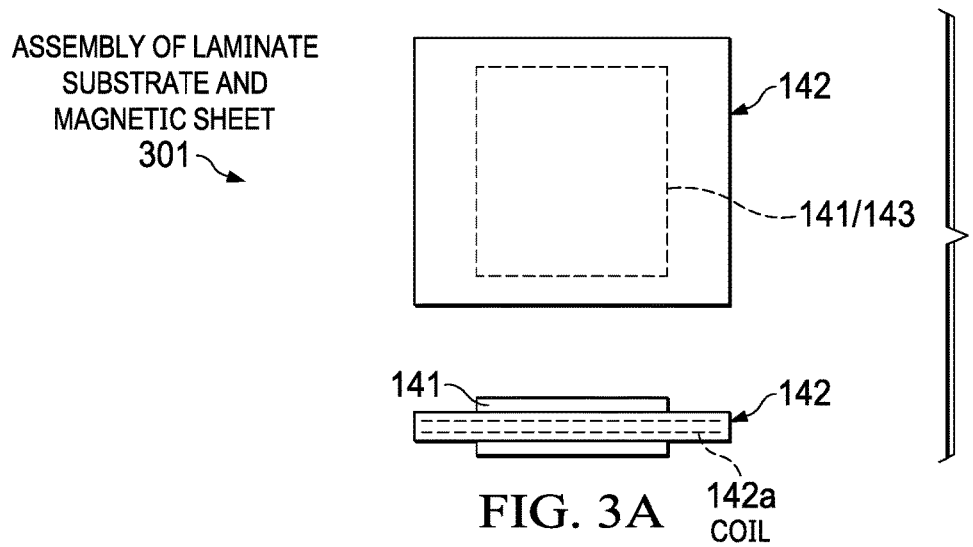
FIGS. 3A-E depict successive views of an in-process isolated power converter package corresponding to results following steps in an example method for forming a disclosed isolated power package comprising a leadframe including first and second die pads having first and second semiconductor die mounted thereon, and supports, and a transformer stack on the supports. The transformer stack is connected between the first and the second semiconductor die, and the supports are connected by an exposed downset pad by a downset feature, where the downset pad is exposed at a bottom side of the package from the mold compound.
Figure 3B:
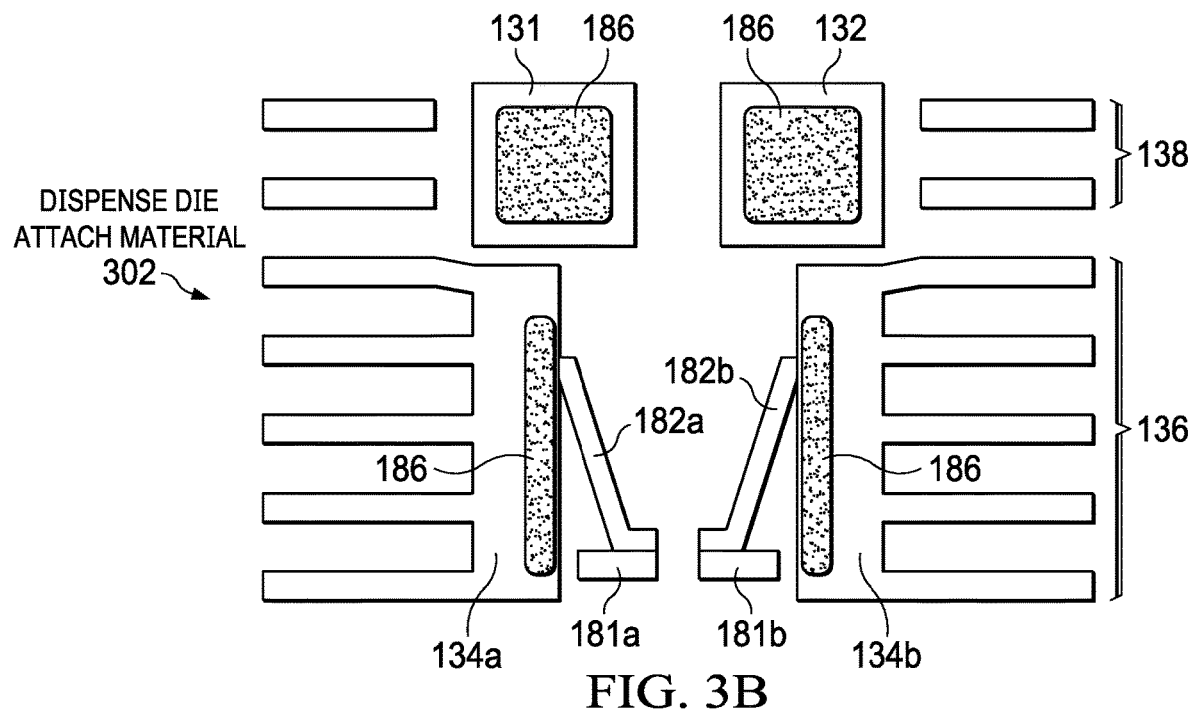

FIGS. 3A-E depict successive views of an in-process isolated power converter package 100 corresponding to results following steps in an example method for forming a disclosed isolated power package, including a downset pad(s), a downset feature(s) providing a connection from the supports to the downset pad for enhanced cooling of the transformer stack 140. FIG. 3A shows results after step 301 which comprises providing a transformer stack 140.

Figure 3C:
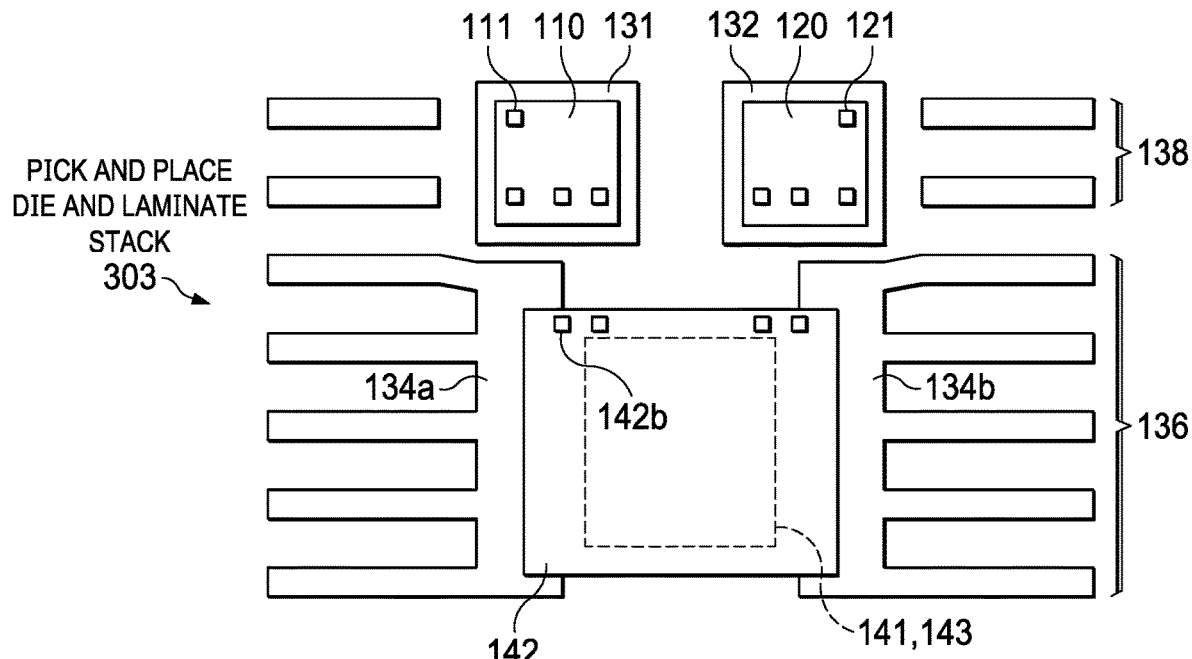
Figure 3D:
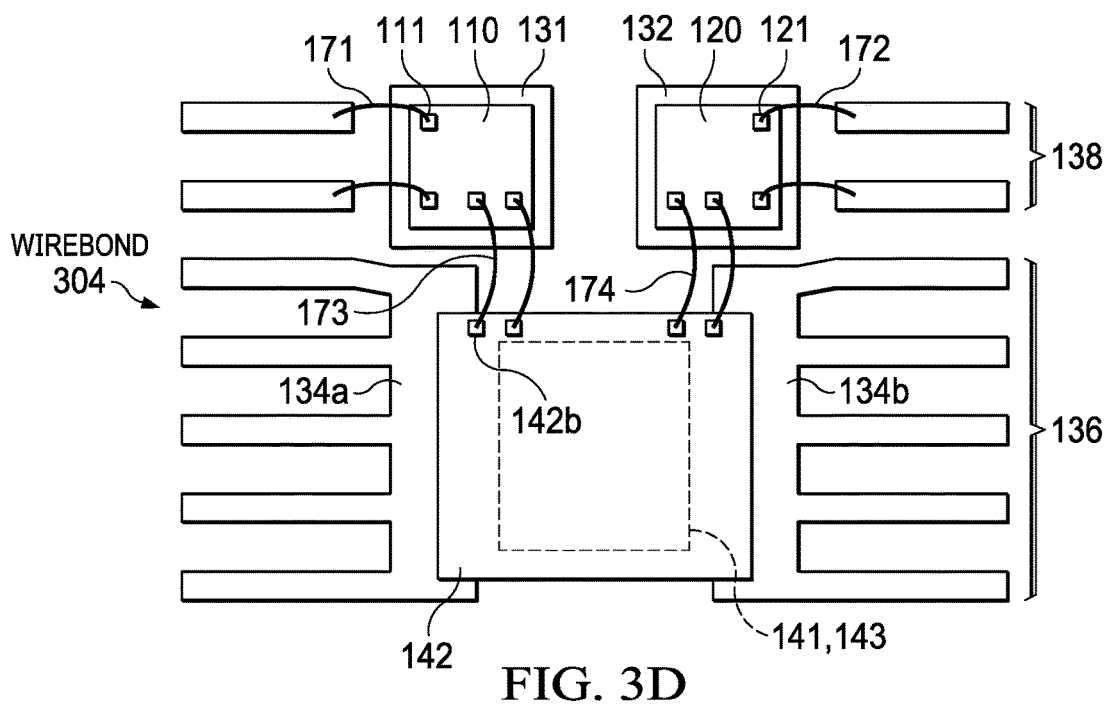
Figure 3E:
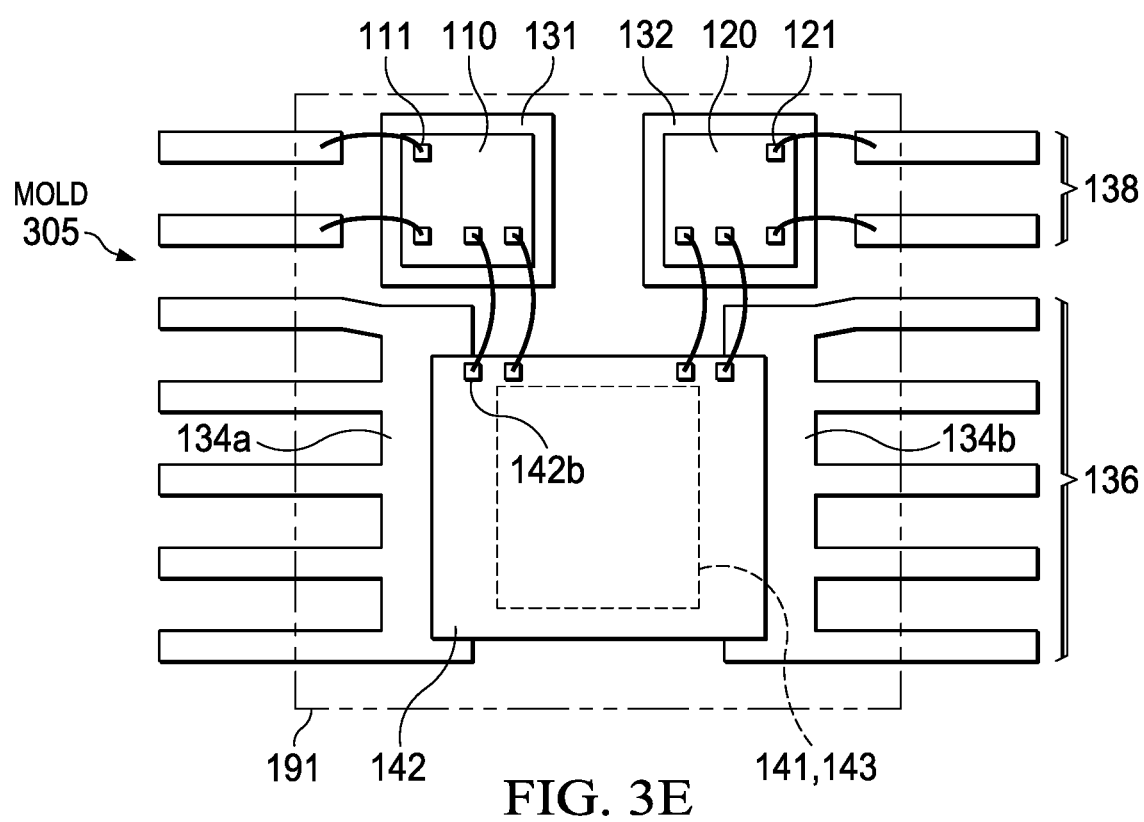

FIG. 3B shows results after step 302 comprising dispensing a die attach adhesive material 186 that is generally thermally conductive onto the first and second die pads 131, 132, and onto the supports 134a, 134b. The leadframe can be seen to also include a first plurality of leads 136 noted above to be connected to the supports 134a, 134b, and a second plurality of leads 136, at least one exposed downset pad shown as downset pads 181a, 181b, and at least one downset feature shown as downset features 182a, 182b connected between the supports 134a, 134b and the downset pads 181a, 181b. It should be appreciated that while the downset features 182a, 182b and downset pads 181a, 181b appear to be shown in side view (as in FIG. 1) for illustration purposes, in actuality in a top view, the downset features 182a, 182b and downset pads 181a, 181b extend downward and away from supports 134a, 134b, with the downset pads 181a, 181b being at the distal end of the downset features 182a, 182b, with a bottom surface of the downset pads 181a, 181b facing away from the top view FIG. 3C shows results after step 303 comprising a pick and place of the first semiconductor die 110 on the first die pad 131 and second semiconductor die 120 on the second die pad 132, and the laminate substrate 142 of the transformer stack 140 on the supports 134a, 134b. The x-dimension of the laminate substrate 142 is configured to be dimensioned to enable the pick and place assembly of the transformer stack 140 so that the laminate substrate 142 rests on the supports 134a, 134b. Step 304 comprises the in-process isolated power converter package 100 shown in FIG. 3D after wirebonding to provide wirebonds 171, 172, 173 and 174. Step 305 shown in FIG. 3E shows the in-process isolated power converter package 100 after molding to form the mold compound 191.

Figure 4:
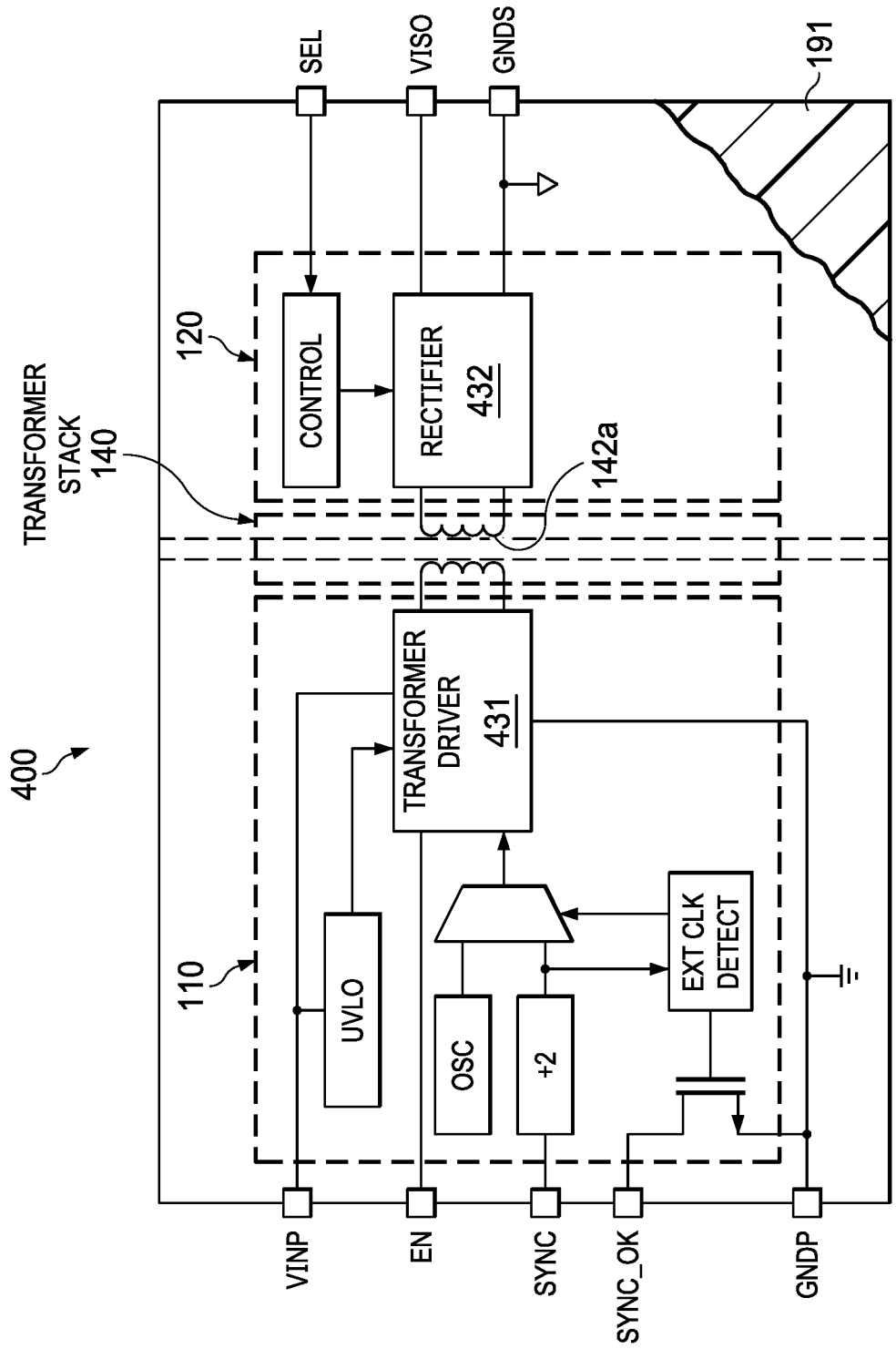
FIG. 4 shows a functional block diagram for an example isolated DC-DC converter package. The isolated DC-DC converter package comprises a leadframe including supports for a transformer stack, and first and second die pads with its respective pins being shown. The isolated DC-DC converter includes first and second semiconductor die mounted on the respective die pads. The transformer stack is on the supports, where the transformer stack is connected between the first and the second semiconductor die, the transformer stack is connected between the first and the second semiconductor die, and the supports are connected to a downset pad by a downset feature. The downset pad is exposed at a bottom side of the package from the mold compound.

FIG. 4 shows a functional block diagram for an example isolated DC-DC converter package 400. The isolated DC-DC converter package 400 comprises a leadframe including supports for a transformer stack 140 including at least one coil 142a (that is embedded in a laminate substrate shown above as 142), and first and second die pads with its respective pins representing the leadframe being shown.

The isolated DC-DC converter package 400 comprises a primary side including a first semiconductor die 110 (that is on a first die pad 131 shown in FIG. 2) that includes a transformer driver 431 and a secondary side including a second semiconductor die 120 (that is on a second die pad 132 shown in FIG. 2) including a rectifier 432. The transformer stack 140 is positioned between the first semiconductor die 110 and the second semiconductor die 120.

EXAMPLES

Disclosed aspects are further illustrated by the following specific Examples, which should not be construed as limiting the scope or content of this Disclosure in any way.

Thermal simulation data was obtained to compare the thermal impedance performance for a standard isolated molded DC/DC converter package including a transformer stack mounted on supports of a leadframe, and a disclosed isolated molded DC/DC converter package including the same transformer stack mounted on supports of a leadframe that further includes a downset feature connection from the supports in the laminate attach area of the leadframe to an exposed die pad. A reduction in thermal resistance by about 16% was found to be provided.

Disclosed aspects can be integrated into a variety of assembly flows to form a variety of different semiconductor packages and related products. The semiconductor package can comprise a single IC die or more typically multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. An isolated power converter package, comprising:
a leadframe including a first die pad and a second die pad, first and second supports for supporting a transformer stack connected to a first plurality of leads, a second plurality of leads, at least one downset pad, and at least one downset feature between the first and second supports and the downset pad;
a first semiconductor die including first bond pads on the first die pad and a second semiconductor die including second bond pads on the second die pad;
the transformer stack comprising a top side magnetic sheet and a bottom side magnetic sheet on respective sides of a laminate substrate comprising at least one coil within a dielectric material, including coil contacts on a top surface of the laminate substrate;
wherein edges of the laminate substrate are attached to the first and second supports;
bond wires between the first bond pads and the second plurality of leads, between the second bond pads and the second plurality of leads, between the first bond pads and the coil contacts, and between the second bond pads and the coil contacts, and a mold compound providing encapsulation for the first semiconductor die, the second semiconductor die, and the transformer stack, wherein the downset pad is exposed from the mold compound.

2. The isolated power converter package of claim 1, wherein the at least one downset pad comprises two or more of the downset pads.

3. The isolated power converter package of claim 1, wherein the leadframe comprises a small outline integrated circuit (SOIC), thin small outline package (TSOP), or heatsink small outline package (HSOP) leadframe.

4. The isolated power converter package of claim 1, wherein the first semiconductor die comprises a gate driver, and wherein the second semiconductor die comprises a power field effect transistor (FET) module comprising at least one power FET.

5. The isolated power converter package of claim 1, wherein the first semiconductor die and the second semiconductor die are both attached with a thermally conductive die attach material that provides a 25° C. thermal conductivity of at least 1 W/m·K.

6. The isolated power converter package of claim 1, wherein the downset feature comprises a first downset feature connected to the first support and a second downset feature connected to the second support.

7. The isolated power converter package of claim 1, wherein the downset feature is integrally connected between the first and second supports and the downset pad.

8. The isolated power converter package of claim 1, wherein the first and second supports are both attached with a thermally conductive die attach material that provides a 25° C. thermal conductivity of at least 1 W/m·K.

9. The isolated power converter package of claim 1, wherein the at least one coil comprises a plurality of the coils.

10. A method of forming an isolated power converter package, comprising:
providing a transformer stack comprising a top side magnetic sheet and a bottom side magnetic sheet on respective sides of a laminate substrate comprising at least one coil within a dielectric material;
dispensing a die attach material onto a first die pad and a second die pad and on first and second supports for supporting the transformer stack of a leadframe, the leadframe including a first plurality of leads connected to the first and second supports and a second plurality of leads, at least one downset pad, and at least one downset feature between the first and second supports and the downset pad;
positioning a first semiconductor die including first bond pads on the first die pad, a second semiconductor die including second bond pads on the second die pad, and the transformer stack with edges of the laminate substrate on the first and second supports;
wirebonding between the first bond pads and the second plurality of leads, between the second bond pads and the second plurality of leads, between the first bond pads and contacts on the laminate substrate, and between the second bond pads and contacts on the laminate substrate, and
molding to form a mold compound providing encapsulation for the first semiconductor die, the second semiconductor die, and for the transformer stack, wherein a bottom side of the downset pad is exposed from the mold compound.

11. The method of claim 10, wherein the edges of the laminate substrate are attached to the first and second supports by a thermally conductive adhesive material having a 25° C. thermal conductivity of at least 1 W/m·K.

12. The method of claim 10, wherein the first semiconductor die comprises a gate driver, and wherein the second semiconductor die comprises a power field effect transistor (FET) module comprising at least one power FET.

13. The method of claim 10, wherein at least one downset pad comprises two or more of the downset pads.

14. The method of claim 10, wherein the leadframe comprises a small outline integrated circuit (SOIC), thin small outline package (TSOP), or heatsink small outline package (HSOP) leadframe.

15. The method of claim 10, wherein the first semiconductor die and the second semiconductor die are both attached with a thermally conductive die attach material that provides a 25° C. thermal conductivity of at least 1 W/m·K.

16. The method of claim 10, wherein the downset feature comprises a first downset feature connected to the first support and a second downset feature connected to the second support.

17. The method of claim 10, wherein the downset feature is integrally connected between the first and second supports and the downset pad.

18. The method of claim 10, wherein the first and second supports are both attached with a thermally conductive die attach material that provides a 25° C. thermal conductivity of at least 1 W/m·K.

19. An isolated DC-DC converter package, comprising:
a leadframe including a first die pad and a second die pad, first and second supports for supporting a transformer stack connected to a first plurality of leads, a second plurality of leads, at least one downset pad, and at least one downset feature between the first and second supports and the downset pad;
a first semiconductor die comprising a gate driver including first bond pads on the first die pad and a second semiconductor die comprising a power field effect transistor (FET) module comprising at least one power FET including second bond pads on the second die pad;
the transformer stack comprising a top side magnetic sheet and a bottom side magnetic sheet on respective sides of a laminate substrate comprising at least one coil within a dielectric material, including coil contacts on a top surface of the laminate substrate;
wherein edges of the laminate substrate are attached to the first and second supports;
bond wires between the first bond pads and the second plurality of leads, between the second bond pads and the second plurality of leads, between the first bond pads and the coil contacts, and between the second bond pads and the coil contacts, and
a mold compound providing encapsulation for the first semiconductor die, the second semiconductor die, and the transformer stack,
wherein the downset pad is exposed from the mold compound.

20. The isolated DC-DC converter package of claim 19, wherein the downset feature is integrally connected between the first and second supports and the downset pad.

* * * * *